(12) United States Patent
Bradley et al.

(10) Patent No.: US 10,917,102 B2
(45) Date of Patent: Feb. 9, 2021

(54) SIGNAL GAUGE

(71) Applicant: Analog Devices International Unlimited Company, Limerick (IE)

(72) Inventors: Shaun Bradley, Patrickswell (IE); David Aherne, Limerick (IE)

(73) Assignee: Analog Devices International Unlimited Company, Limerick (IE)

( * ) Notice: Subject to any disclaimer, the term of this patent is extended or adjusted under 35 U.S.C. 154(b) by 0 days.

(21) Appl. No.: 16/356,985

(22) Filed: Mar. 18, 2019

(65) Prior Publication Data

US 2020/0304134 A1 Sep. 24, 2020

(51) Int. Cl.
| | | |
|---|---|---|
| H03M 1/10 | (2006.01) | |
| H03M 1/06 | (2006.01) | |
| H03M 1/66 | (2006.01) | |
| H03M 1/12 | (2006.01) | |
| H01H 9/00 | (2006.01) | |
| H02H 3/10 | (2006.01) | |

(52) U.S. Cl.
CPC ....... *H03M 1/0687* (2013.01); *H03M 1/0636* (2013.01); *H03M 1/1071* (2013.01); *H03M 1/12* (2013.01); *H03M 1/66* (2013.01); *H01H 9/00* (2013.01); *H02H 3/105* (2013.01)

(58) Field of Classification Search
CPC ........ H03M 1/1071; H01H 9/00; H02H 3/105
USPC .................................. 341/120; 361/115, 42
See application file for complete search history.

(56) References Cited

U.S. PATENT DOCUMENTS

| | | | |
|---|---|---|---|
| 4,949,029 A | 8/1990 | Cooper et al. | |
| 5,185,705 A * | 2/1993 | Farrington | H02H 3/00 361/115 |
| 5,341,503 A | 8/1994 | Gladstein et al. | |
| 5,548,527 A | 8/1996 | Hemminger et al. | |
| 5,966,723 A | 10/1999 | James et al. | |
| 6,353,324 B1 | 3/2002 | Uber, III et al. | |
| 6,377,028 B1 * | 4/2002 | Armstrong, II | H02J 7/0047 320/136 |
| 7,490,025 B2 | 2/2009 | Chao et al. | |
| 7,773,413 B2 | 8/2010 | Shalvi | |
| 7,921,719 B2 | 4/2011 | Arnold et al. | |
| 8,122,185 B2 | 2/2012 | Merry, Jr. et al. | |
| 8,374,045 B2 | 2/2013 | Givant et al. | |
| 8,755,484 B2 | 6/2014 | Hutchings et al. | |
| 2006/0107746 A1 | 5/2006 | Albert et al. | |
| 2008/0048879 A1 | 2/2008 | Lipman | |
| 2015/0179237 A1 | 6/2015 | Jeong | |
| 2015/0186578 A1 | 7/2015 | Lehoty et al. | |
| 2017/0299650 A1 | 10/2017 | Coyne et al. | |
| 2017/0337007 A1 | 11/2017 | Tailliet et al. | |

FOREIGN PATENT DOCUMENTS

EP 2420804 2/2012

\* cited by examiner

*Primary Examiner* — Joseph J Lauture
(74) *Attorney, Agent, or Firm* — Schwegman Lundberg & Woessner, P.A.

(57) ABSTRACT

There is provided an analog signal gauge that monitors an analog signal at a node and a non-volatile memory element to store an event that occurs at the node when a certain criteria, such as exceeding a maximum safe threshold, is satisfied. This way, the analog signal gauge can help to provide an accurate picture of the operating characteristics in the analog circuit which it is monitoring, including indications of faults that occur in the analog system.

26 Claims, 16 Drawing Sheets

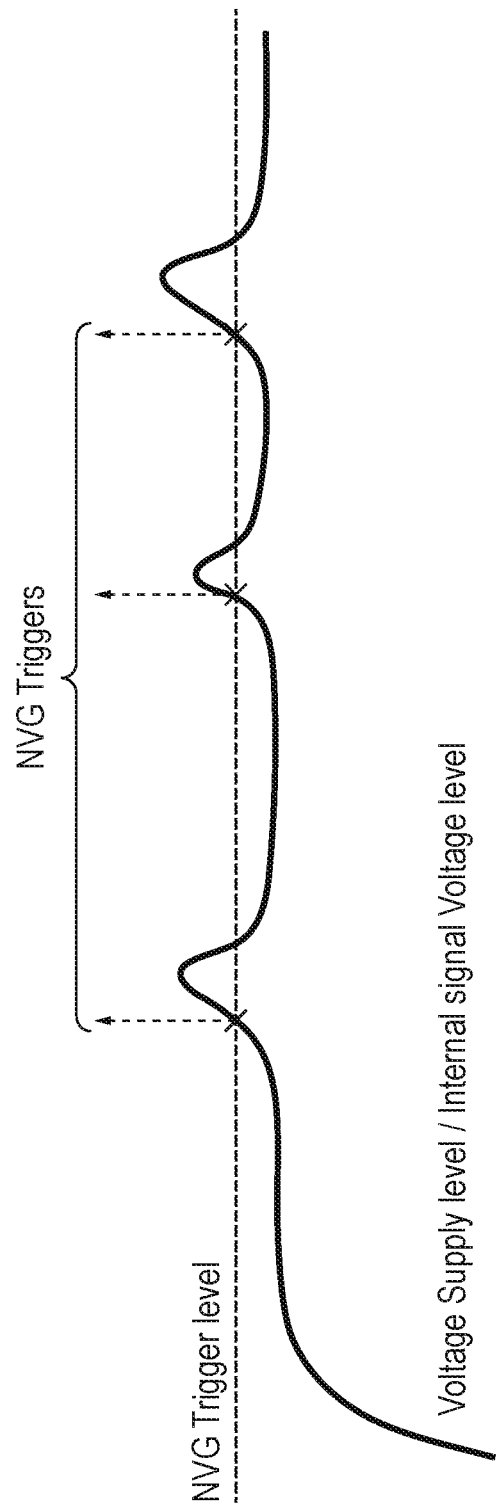

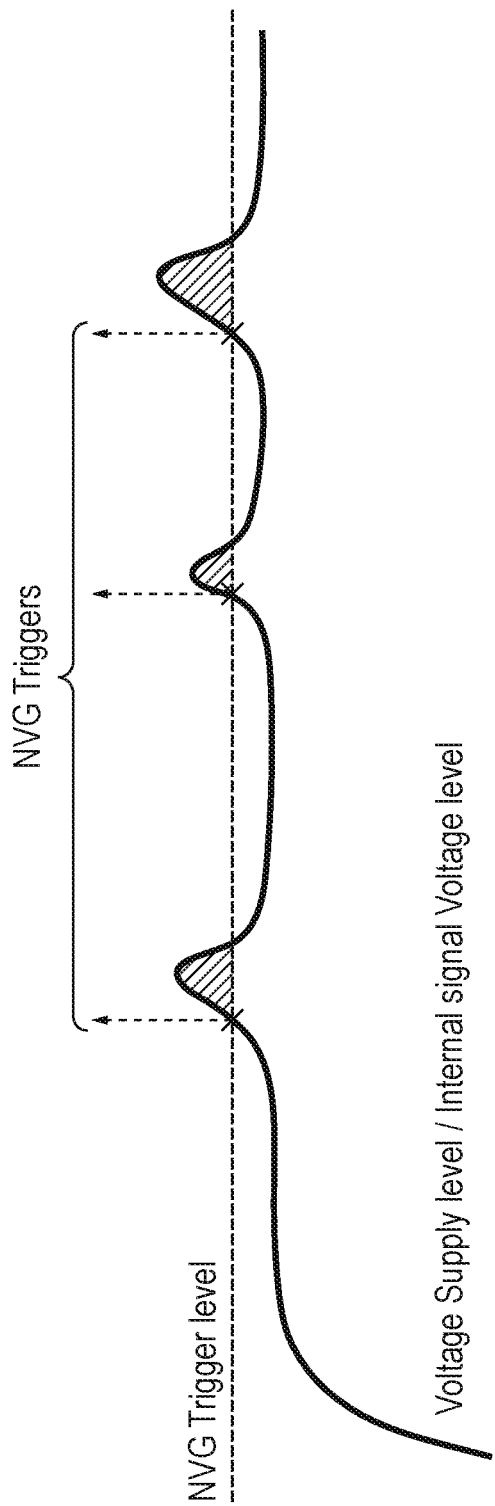

SIGNAL GAUGE

FIELD OF THE DISCLOSURE

The present disclosure relates to the field of signal gauges and more particularly, but not exclusively, it relates to analog signal gauges for monitoring a node of an analog system so that faults in the analog system may be logged.

BACKGROUND

When analog circuitry develops a fault, it is often not known how and why the fault occurred. In many analog systems, it is important to know the maximum value that a node has reached, whether a threshold has been exceeded at the node, or determine an accumulated measurement at that node. This information can be used for system tuning, calibration or adjustment.

Currently, in many industries such as the consumer, industrial and communications industries, no effort has been made traditionally to find faults. In other industries such as the automotive industry, processes are sometimes used in the design process for fault finding, for example, by setting up a mode on analog-to-digital converters (ADCs) or digital-to-analog converters (DACs) that are already on-chip for testing. However, this type of testing focuses on the design stage and nothing is done regarding fault finding when the analog circuits are in use.

SUMMARY OF THE DISCLOSURE

Therefore, the present inventors have recognized that there is a need for a way to improve detection of faults in analog devices.

There is provided in the present disclosure an analog signal gauge having a conditioning circuit that monitors an analog signal at a node and a non-volatile memory element to store an event that occurs at the node when a certain criteria, such as exceeding a maximum safe threshold, is satisfied. This way, the analog signal gauge can help to provide an accurate picture of the operating characteristics in the analog circuit which it is monitoring, including indications of faults that occur in the analog system.

For example, if the net power of an analog system reaches a value that is outside of the scope of the product specification, then an indication of this could be logged by the analog signal gauge of the present disclosure. In another example, if the analog node reaches a value that is outside the scope of the product design parameters, then this could be logged and used to debug the analog system. In another example, if the node of the analog circuit or net power of the analog system stays above a given value for an extended period of time that is outside the scope of the product specification, then this could also be logged.

According to a first aspect of the disclosure, there is provided an analog signal gauge, comprising: a conditioning circuit, configured to monitor an analog signal at a node in an analog circuit; and at least one non-volatile memory (NVM) element; wherein the conditioning circuit is configured to record an event in the NVM element, in response to the analog signal satisfying a first criteria.

The analog gauge operates by monitoring a particular signal in an analog circuit and provides a dedicated solution for fault finding. Specifically, the conditioning circuit monitors the signal for a particular condition or criteria and the conditioning circuit may also be tuned to the analog circuit being measured.

If the condition or criteria occurs, the conditioning circuit may store this information or event by setting a bit within a NVM element in either analog or digital format.

The conditioning circuit may be further configured to compare the analog signal with a first threshold, and to log an event in the NVM element when the first threshold is exceeded, or each time the first threshold is exceeded. Usually, the voltage and/or current of the analog signal is compared.

In some examples, the conditioning circuit may be configured to initially convert a parameter to a representative voltage and/or current before comparing with a first threshold. For example, temperature at the analog node could be measured by a diode and then converted into a representative voltage before it is compared with a first voltage threshold.

The conditioning circuit may be configured to log an event by charging or discharging the NVM element.

Floating gate transistor technology may be used to hold the electrical charge in the NVM element and thus store data. A floating gate transistor has two gates: a floating gate and a control gate. The two gates are separated from one another by a thin dielectric material, for example, an oxide layer. The floating gate is isolated from the oxide layer and so any electrons placed on the floating gate are trapped. As a result, the memory element is non-volatile.

The amount of charge left in the NVM element can then be probed in order to determine whether the event has occurred and, in some cases, details of the nature of the event(s) that have occurred. The nature of the event(s) could be time that the analog signal stays above the first threshold, for example.

Specifically, a signal from a power source could be monitored by the conditioning circuit to see if the voltage level increases above a predetermined threshold and, if so, the conditioning circuit could record this event in a bit of the NVM element by charging or discharging the NVM element. In another example, in addition to measuring whether or not a signal goes above a predetermined threshold, the signal gauge could include a counter to time the amount of time a signal remains above the predetermined threshold. The counter could set a bit in the NVM element memory each time it increments during the time in which the signal remains above the threshold. In yet another example, temperature at an analog node could be measured using a temperature sensor such as a diode. The conditioning circuit could then convert the measured temperature into a representative voltage, which is compared to a threshold voltage. If the representative voltage is above the threshold voltage, then the conditioning circuit could record this event in a bit of the NVM element by charging or discharging the NVM element.

There may be more than one threshold being monitored by the conditioning circuit. In this case, the conditioning circuit may be further configured to compare the analog signal with an $n^{th}$ threshold, and to log an event each time the analog signal exceeds or goes below the $n^{th}$ threshold, wherein n≥2. Preferably, a larger value of n causes a greater rate of charging or discharging of the NVM element and so the logging of the event is dynamic.

The NVM element may be a single capacitor pair for storing a single bit or it may be a multi-bit memory to record the number of times the analog signal increases above a pre-determined threshold, depending on what is being measured and what data is being extracted. A single NVM element could be used for monitoring a single node in an analog circuit or a plurality of nodes in an analog circuit.

Alternatively, a different NVM element could be used for monitoring each of a plurality of nodes in an analog circuit. Non-volatile memory is used so that the data is maintained in memory even if the device is switched off after a power-cycle.

The NVM element may be hardwired to a particular analog node, which is fixed at the design stage. Alternatively, there may be a number of switches in the NVM element for dynamic operation, allowing selection of different nodes, and this may be programmable at the manufacture stage.

In some non-volatile memory such as flash memory, it is typical for half of the real estate to be taken up by its conditioning circuit, which reads in and out of the memory. However, in the present disclosure, the NVM element could be set/cleared in the production process/factory so all the conditioning circuit needs to do is write to the NVM element. As such, the conditioning circuit can be small and also inexpensive. In one example, the conditioning circuit may comprise a resistor network with an operational amplifier.

Unlike solid state drives (SSDs) in personal computers (PCs) and laptops, the solid state semiconductor gauge of the present disclosure does not store a large amount of information.

The solution provided by the present disclosure may be implemented on-chip in silicon on a device or formed in an integrated circuit with the analog circuit which is being monitored. Alternatively, the analog signal gauge may be formed separately from the analog circuit, for example, on a different chip.

The analog signal gauge may be for monitoring an analog signal in an internal power supply or an analog subsystem. In these cases, the analog signal gauge of the present disclosure is advantageous because very small amounts of data can be recorded about the operation of the analog circuit without losing that data when power to the analog circuit is lost. Whilst the solution provided by the present disclosure may be simple, it is expected that it will be useful in many applications, including in the automotive, industrial and medical industries.

The conditioning circuit may be further configured to cause the NVM element to be reset to its original state of charge or discharge when the analog signal drops below a reset threshold, the reset threshold being lower than the first threshold. In this example, the conditioning circuit does not merely act as a monitor, but it also takes action and disables the device if certain conditions are met, i.e. the signal gauge provides functional safety. It could be that if voltage on the power supply goes over the threshold for more the x ns, then the device may be powered down, or if it goes over the threshold at all. However, sometimes, it is preferable that no further action is taken in connection with the data. Rather, the data is simply maintained in the device for later analysis.

In cases where functional safety is provided by the signal gauge for fault detection, the conditioning circuit may further comprise a breakdown-type device such as a Zener diode or a p-n junction diode for setting the reset threshold.

The conditioning circuit may comprise a comparator for comparing the analog signal with a first threshold, $n^{th}$ threshold and/or reset threshold.

The conditioning circuit may comprise a timer, and the conditioning circuit may be configured to start the timer when the analog signal goes over the first or $n^{th}$ threshold, and to stop the timer when the analog signal goes below that threshold, and to record in the NVM element the time spent over the threshold.

The timer may be time period based, i.e. counts down for period of time then sets a bit to indicate that one time period has passed. Then, when a threshold is exceeded and recorded, it would be possible to tell what time period it occurred in.

Using the timer, the conditioning circuit may be further configured to compare the analog signal with the first threshold, and to log an event if the analog signal remains over the threshold for more than a predetermined amount of time.

The analog signal gauge may also comprise a control circuit, wherein the control circuit is configured to control a first aspect of the analog circuit if a first condition is met. In the example where functional safety is provided by the signal gauge for fault detection, the control circuit may cause the conditioning circuit to reset the analog circuit when the voltage drops below a reset threshold that is lower than the first threshold. Alternatively, an instantaneous over-temperature event may translate into an over-voltage that is monitored by the conditioning circuit. Then, the control circuit reduces the voltage at the analog node. In addition to either of the above scenarios, the control circuit could also set a flag off-chip through a network connection so as to alert a user to the occurrence of the event.

The analog signal gauge may further comprise a read circuit, configured to read the NVM element. The read circuit enables access to the stored information. The read circuit may include a register, and the read circuit may only be accessible if correct code is entered into the register.

According to a second aspect of the disclosure, there is provided an integrated circuit comprising the analog signal gauge as described in any of the examples above. The integrated circuit may further comprise the analog circuit configured to be monitored.

According to a third aspect of the disclosure, there is provided a method of monitoring an analog signal by an analog signal gauge, the analog signal gauge comprising a conditioning circuit and at least one non-volatile memory (NVM) element wherein the method comprises: monitoring, by the conditioning circuit, an analog signal at a node in an analog circuit; and recording, by the conditioning circuit, an event in the NVM element, in response to the analog signal satisfying a first criteria.

The method may further comprise: comparing, by the conditioning circuit, the analog signal with a first threshold; and logging an event in the NVM element when the first threshold is exceeded. The method may further comprise logging an event each time the first threshold is exceeded.

Additionally or alternatively, the method may further comprise: comparing, by the conditioning circuit, the analog signal with an $n^{th}$ threshold; and logging an event each time the analog signal exceeds or goes below the $n^{th}$ threshold, wherein n≥2 Preferably, a larger value of n causes a greater rate of charging or discharging of the NVM element.

BRIEF DESCRIPTION OF THE DRAWINGS

Examples of the present disclosure will now be described, by non-limiting example only, with reference to the accompanying drawings, in which:

FIGS. 6(a) and 6(b) show aspects of the recordal of the event in accordance with the fifth example of the present disclosure;

DETAILED DESCRIPTION

It has been recognised by the present inventors that there is a need for a way to improve detection of faults in analog devices.

Analog circuits include components which produce analog signals that vary continuously over time. These analog signals have qualities such as voltage or current that must stay within certain operating parameters, otherwise there is a risk that the analog circuit could be damaged.

When an analog circuit is damaged by an analog signal that has exceeded its operating parameters, it is often difficult to look at the damaged circuit and determine how or why the fault occurred. Especially in integrated circuits, it can also be difficult to determine the exact point, or node, within the analog circuit at which the fault occurred.

In the present disclosure, an analog signal gauge is used for monitoring a node of an analog system so that information about whether an analog signal of an analog circuit in the analog system has satisfied a first criteria.

A conditioning circuit in the analog signal gauge is configured to monitor the analog signal at a node in the analog circuit and it is also configured to record an event in at least one NVM element in response to the analog signal satisfying the first criteria.

Importantly, using the above technique of the present disclosure, the conditioning circuit writes to the NVM element but it does not read data off the NVM. When data is required to be read off the NVM, a separate read circuit may be employed. As such, the analog signal gauge is a simple device that records information about the way in which the analog system is performing without taking up much storage space. It is also possible for the analog signal gauge to be incorporated into the integrated circuit of the analog circuit which is being monitored.

Figure 1:
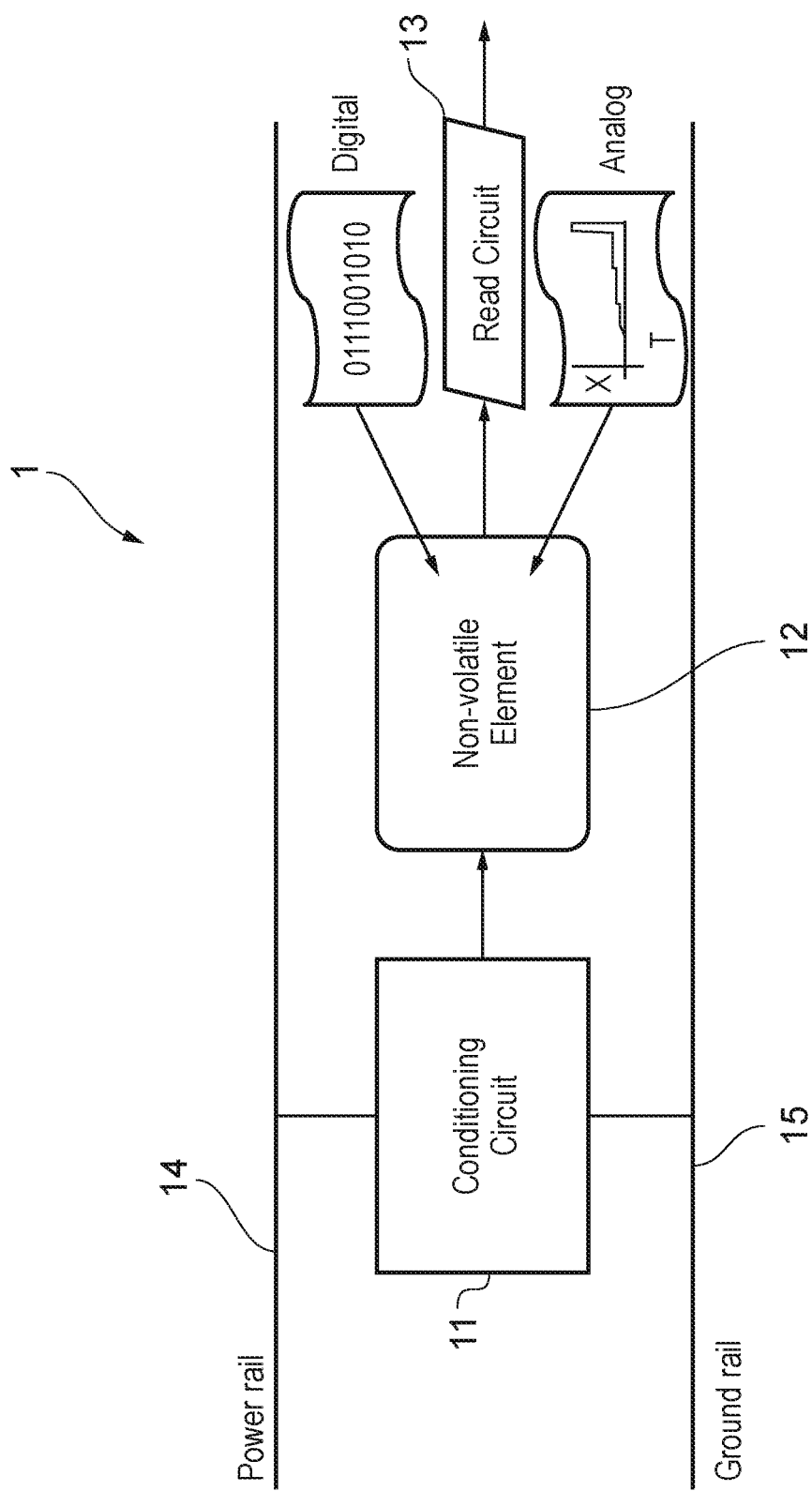
FIG. 1 is a diagram that illustrates an analog signal gauge in accordance with a first example of the present disclosure.

FIG. 1 shows an analog signal gauge 1 that has a conditioning circuit 11 between a power rail 14 and a ground rail 15, and a NVM element 12 in accordance with a first example of the present disclosure. The conditioning circuit 11 is configured to monitor an analog signal at a node of an analog circuit. It records an event in the NVM element 12 when the analog signal satisfies a first criteria. The first criteria could be a first threshold to which the analog signal is compared. The conditioning circuit 11 is configured to log an event in the NVM element 12 when the first threshold is exceeded. The first threshold could be a voltage that is measured directly, or voltage that is determined from a direct temperature measurement, for example. The logging could be charging or discharging the NVM element, which is described in more detail below with reference to FIGS. 12(a) and 12(b).

A read circuit 13 is also shown in FIG. 1 and it is configured to read the NVM element 12, which has information stored in either analog or digital format. The digital formal will be described in greater detail below with reference to FIG. 11. Once the data is read out, it can be used to determine whether a fault has occurred in the analog system.

In the first example of the present disclosure, the analog signal gauge is not implemented on the same integrated circuit as the analog circuit having the node which is being monitored. In this example, the read circuit is also implemented separately. However, in other examples, the analog signal gauge and/or the read circuit may be implemented on-chip.

Figure 2:
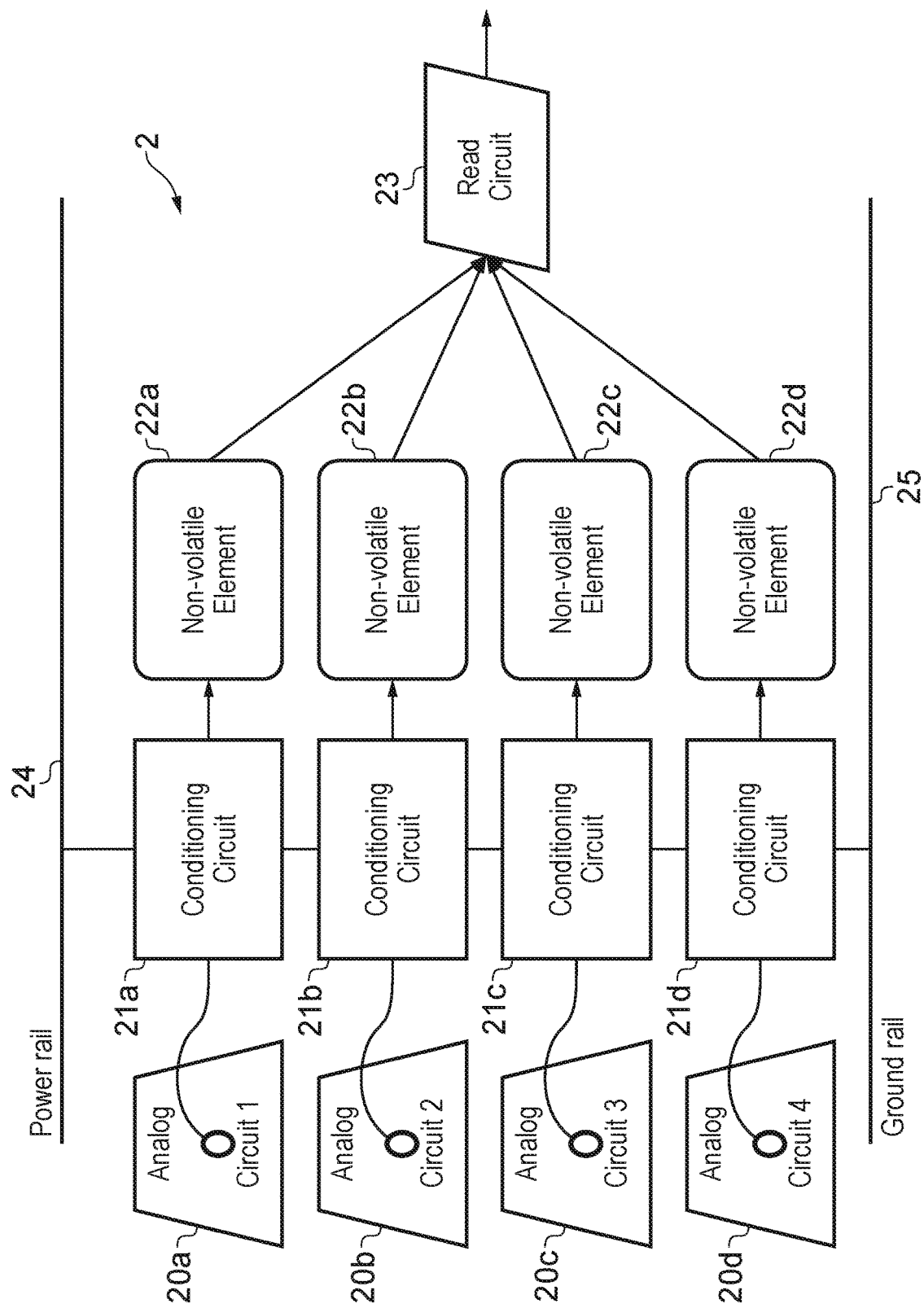
FIG. 2 is a diagram that illustrates an analog signal gauge in accordance with a second example of the present disclosure.

FIG. 2 shows an analog signal gauge 2 that has more than one conditioning circuit between a power rail 24 and a ground rail 25, and more than one NVM element. Namely, it has conditioning circuits 21a, 21b, 21c, 21d and NVM elements 22a, 22b, 22c, 22d in accordance with a second example of the present disclosure. The conditioning circuit 21a monitors an analog signal at a node in analog circuit 20a, the conditioning circuit 21b monitors an analog signal at a node in analog circuit 20b, the conditioning circuit 21c monitors an analog signal at a node in analog circuit 20c and the conditioning circuit 21d monitors an analog signal at a node in analog circuit 20d. Then, a read circuit 23, configured to read the NVM elements 22a, 22b, 22c, 22d, can be used to determine whether a first criteria has been satisfied by an analog signal at a node of one or more of the analog circuits 20a, 20b, 20c, 20d, which has been recorded by the conditioning circuits 21a, 21b, 21c, 21d in the NVM elements 22a, 22b, 22c, 22d, respectively.

Rather than each analog circuit/conditioning circuit/NVM element being implemented separately, in the second example of the present disclosure, each analog circuit 20a, 20b, 20c, 20d, each conditioning circuit 21a, 21b, 21c, 21d, each NVM element 22a, 22b, 22c, 22d and the read circuit 23 are implemented on the same integrated circuit. This provides the benefits of smaller circuit sizes and lower power consumption. Other benefits include faster response time and lower cost.

Figure 3:
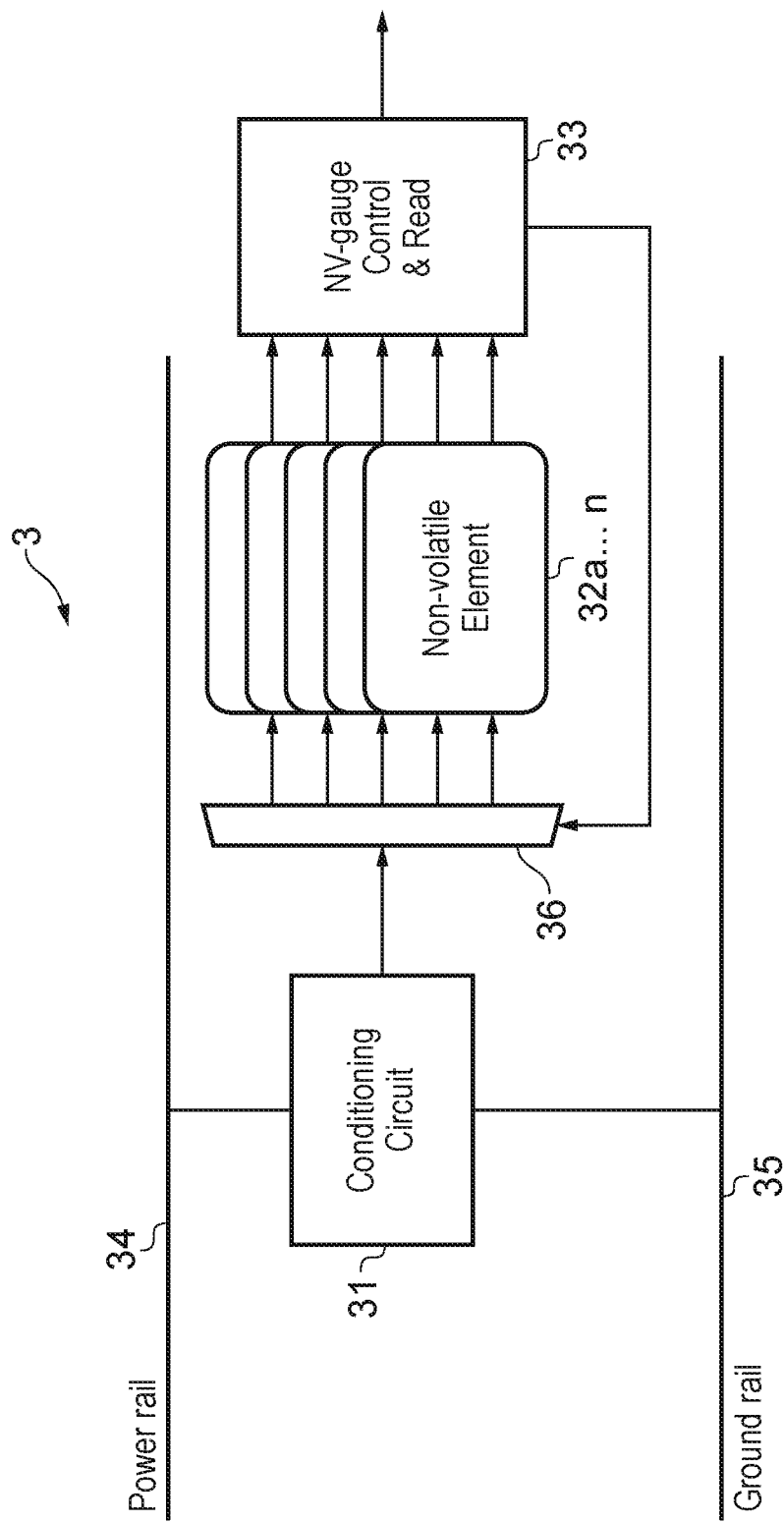
FIG. 3 is a diagram that illustrates an analog signal gauge in accordance with a third example of the present disclosure.

FIG. 3 shows an analog signal gauge 3 that has a plurality of NVM elements 31a . . . n to which a conditioning circuit 31 that is connected between a power rail 34 and a ground rail 35 may record data. The conditioning circuit could be for monitoring an always ON power supply or a gated power supply, for example. As data is recorded to the NVM elements and one NVM element 31a passes a final threshold, the next NVM element 32b is used, as directed by the control and read circuit 33 via a control element 36. Then, the control and read circuit 33 reads out from the plurality of NVM elements 31*a* . . . *n*. If a first condition is met in the analog circuit, the control and read circuit 33 controls a first aspect of the analog circuit. The first condition could be if the voltage at a node in the analog circuit exceeds a reset threshold voltage, then the control and read circuit 33 resets the analog circuit.

The circuits of FIGS. 1, 2 and 3 may be operated in various ways, some of which are described below with reference to FIGS. 4-9.

Figure 4:
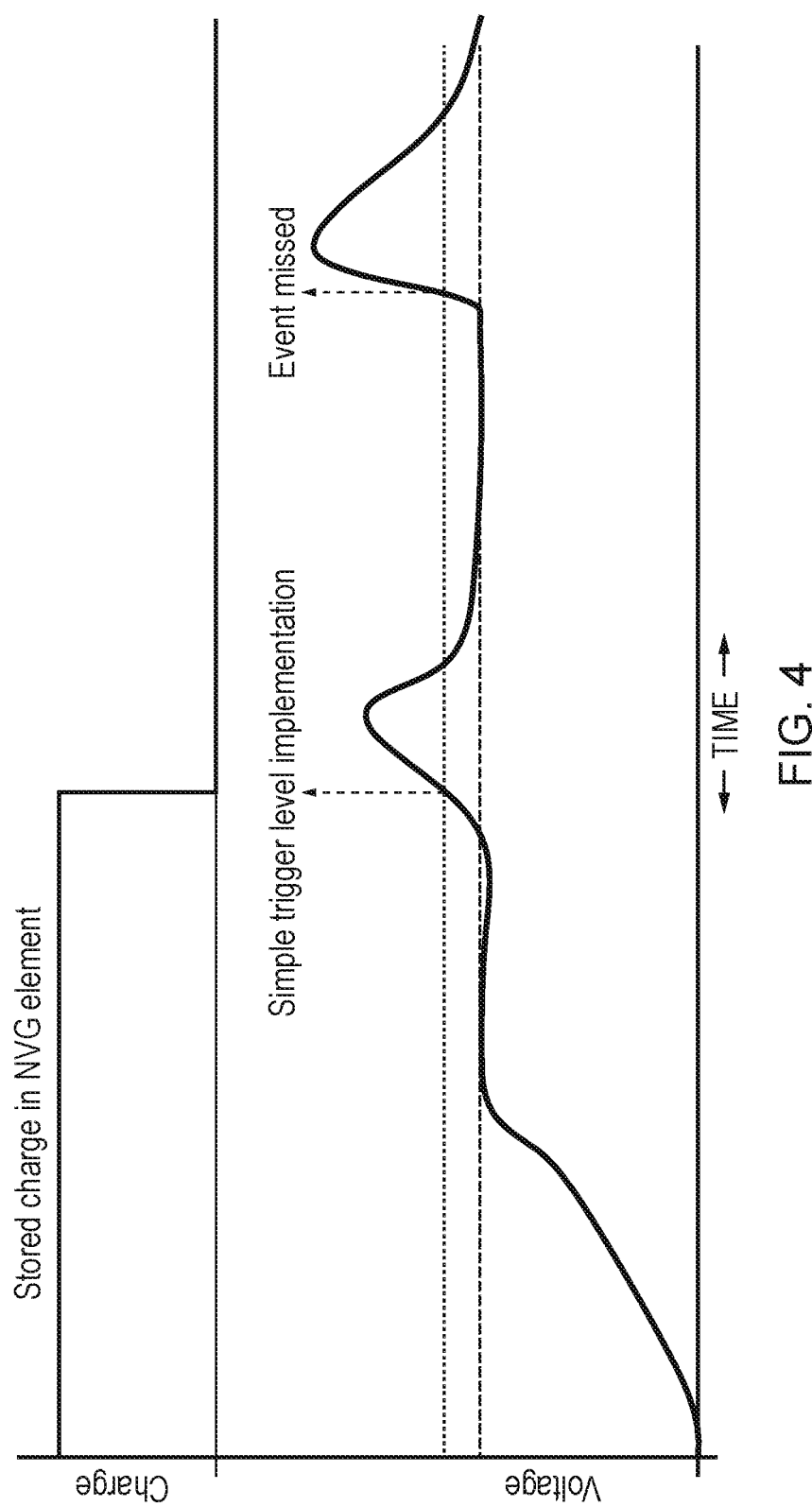
FIG. 4 is a graph showing recordal of an event in accordance with a fourth example of the present disclosure.

In the fourth example of the present disclosure as shown in FIG. 4, charge is stored in a NVM element until a voltage level at a first threshold is exceeded by an analog signal at a node of an analog circuits, at which point the conditioning circuit causes the NVM element to fully discharge. An advantage of this approach is that it is relatively simple and therefore can be relatively straightforward and inexpensive to implement in an integrated circuit with the analog system. However, in this approach, the next time the voltage level is exceeded, the next event is missed by the conditioning circuit.

Figure 5:
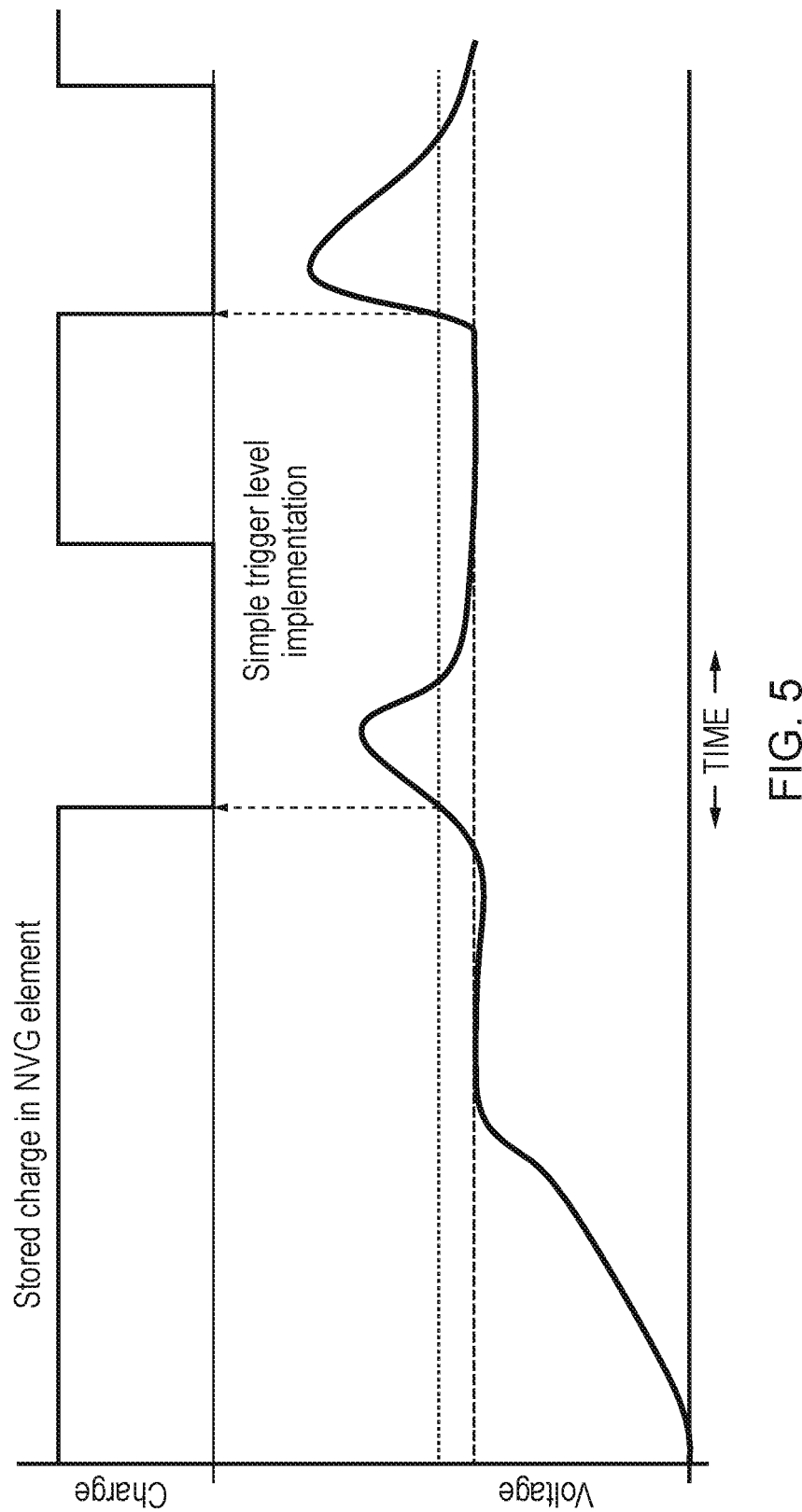
FIG. 5 is a graph showing recordal of an event in accordance with a fifth example of the present disclosure

In the fifth example of the present disclosure as shown in FIG. 5, charge is also stored in a NVM element until a voltage level at a first threshold is exceeded by an analog signal at a node of an analog circuits (as with the fourth example of FIG. 4), after which the NVM element fully discharges. However, when the analog signal drops below a reset threshold, the reset threshold being lower than the first threshold, the conditioning circuit is configured to cause the NVM element to be reset to its original state of charge. Therefore, when the first threshold voltage level is exceeded again, the conditioning circuit can record this event in the NVM element once again by discharging the charge that was restored.

FIGS. 6(*a*) and 6(*b*) show aspects of the recordal of the event in accordance with the fifth example described above. In FIG. 6(*a*), each time a voltage level at a first threshold is exceeded, the event is recorded by the conditioning circuit in at least one NVM element. In FIG. 6(*b*), each time each time a voltage level at a first threshold is exceeded, not only is the event is recorded by the conditioning circuit in at least one NVM element, but an indication of change in charge stored in the NVM element is also recorded by the conditioning circuit.

Figure 7:
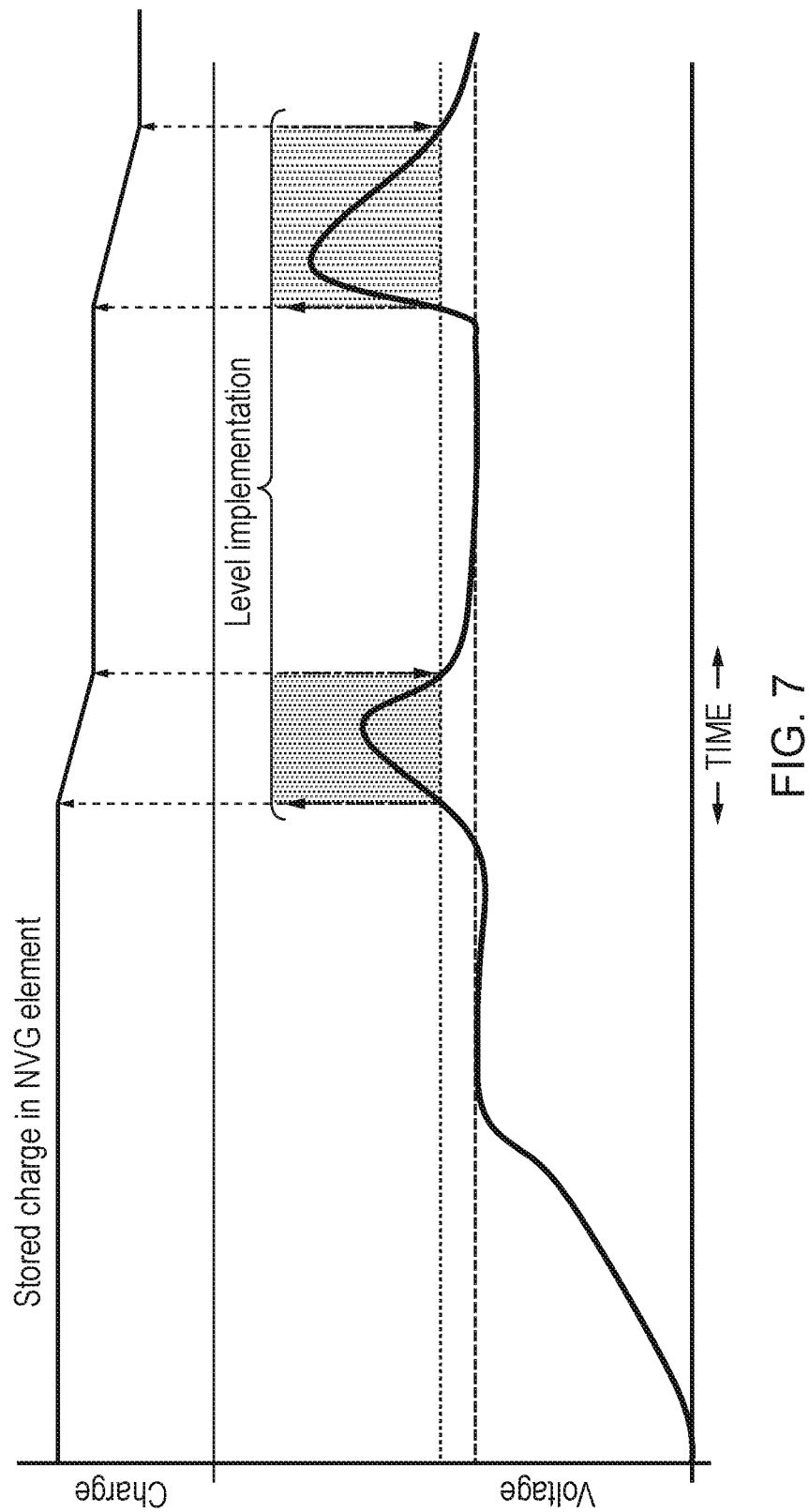
FIG. 7 is a graph showing recordal of an event in accordance with a sixth example of the present disclosure.

In the sixth example of the present disclosure shown in FIG. 7, the same reset principles as the fifth example applies. However, the first event that triggers discharge of the NVM element does not completely deplete the charge in the NVM element. Charge in the NVM element stops depleting once the voltage of the analog signal drops below the first threshold. Then, the second event triggers further depletion of the NVM element until the analog signal drops below the first threshold again. The first and second triggers may cause depletion of the NVM element at the same rate. In other examples, more than two triggers may be provided and the NVM may be discharged in response to each trigger at the same rate.

Figure 8:
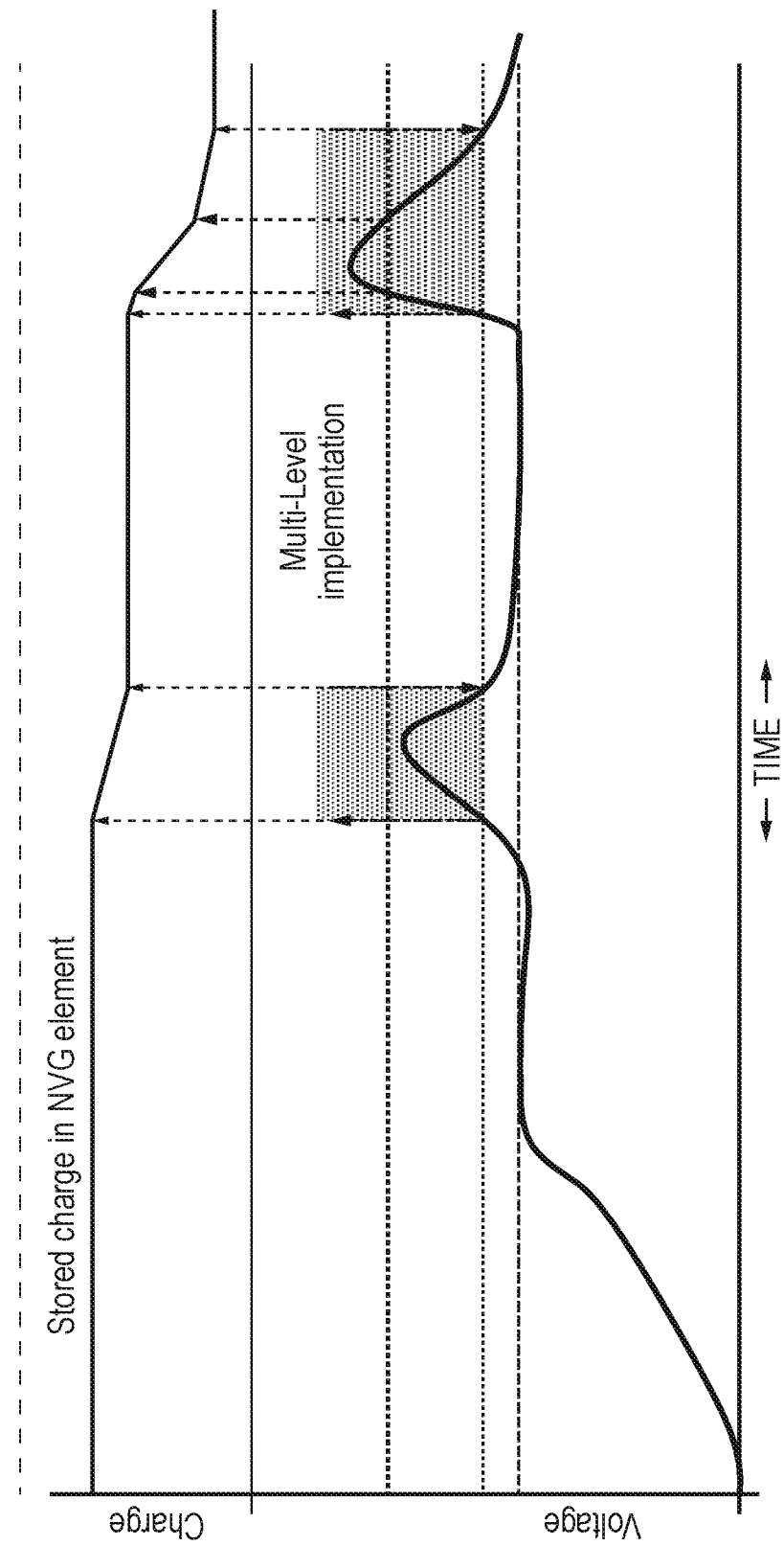
FIG. 8 is a graph showing recordal of an event in accordance with a seventh example of the present disclosure.

In the seventh example of the present disclosure as shown in FIG. 8, two different threshold levels exist and the second threshold causes discharge of the NVM element causes discharge to occur at a faster rate than the first threshold. The first time that the NVM element discharges, only a first threshold is exceeded by the voltage of the analog signal. However, the second time that the NVM element discharges, the first threshold is exceeded and then a second threshold is exceeded by the voltage of the analog signal, and exceeding the second threshold causes discharge of the NVM element causes discharge to occur at a faster rate than when the first threshold is exceeded.

Figure 9:
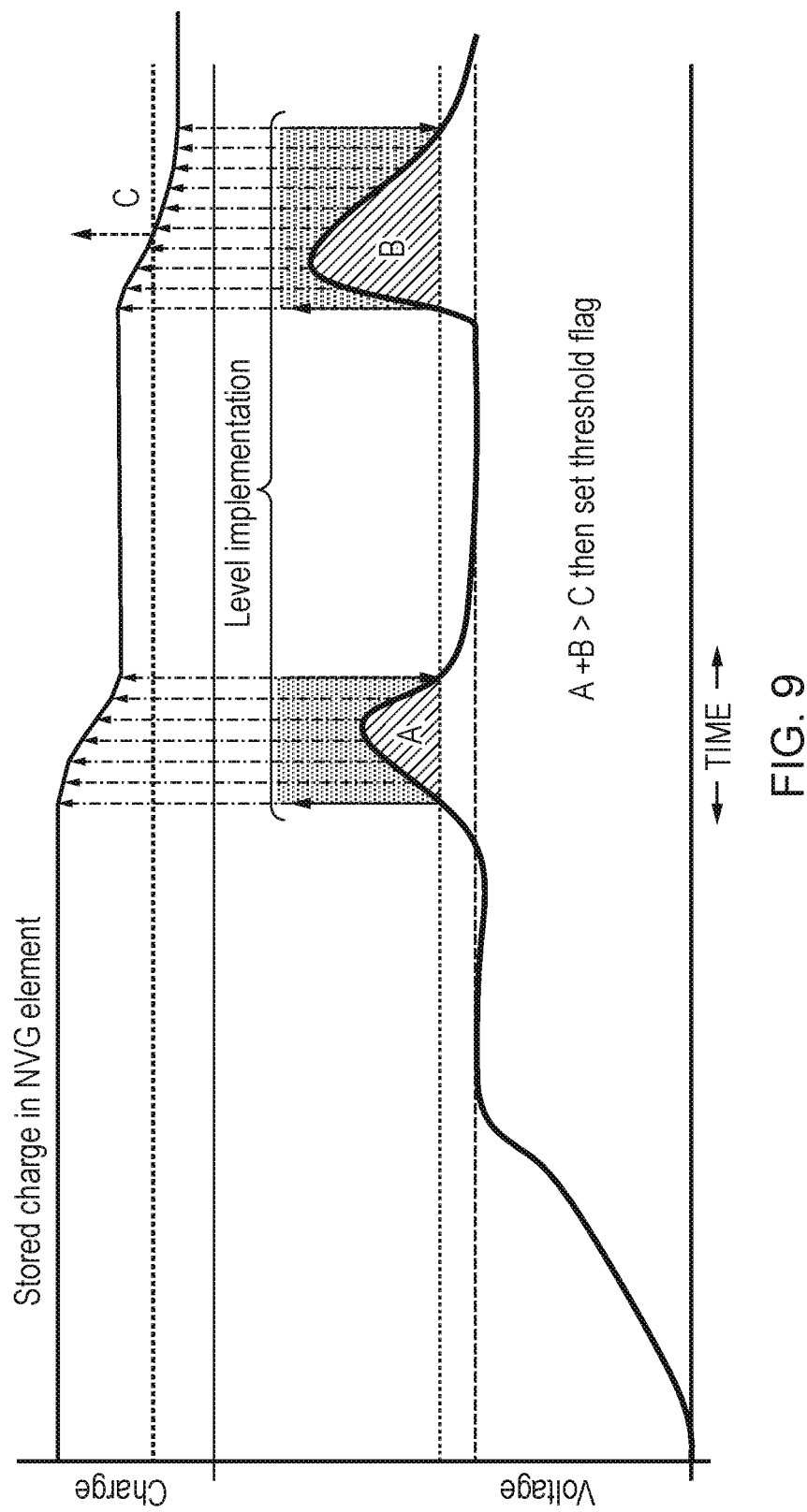
FIG. 9 is a graph showing recordal of an event in accordance with an eighth example of the present disclosure.

In the eighth example of the present disclosure as shown in FIG. 9, n different threshold levels exist and the higher the level of the threshold that is exceeded, the faster the rate of discharge of the NVM element that occurs. As the voltage of the analog signal peaks and decreases again, dropping below the various thresholds, the rate of discharge of the NVM element reverts back to the rate of discharge when the $n^{th}$ threshold is exceeded. This way, the rate of discharge of the NVM element is proportional to the voltage level of monitored signal once the first threshold has been exceeded.

A flag can be set to indicate that change in charge stored in the NVM element has exceeded a predetermined amount. This flag can be set off-chip through a network connection. As shown in the example of FIG. 9 (although this "flag" concept may apply to any of the previous examples too), the flag is set for when the accumulated change in charge in the NVM element exceeds a predetermined amount that indicates that the analog circuit could be damaged if the overvoltage event were allowed to continue for a further period of time. Graphically, this is represented in FIG. 9 by the combined overvoltage A+B indicates that the change in charged stored in the NVM element has caused discharge of the NVM element to amount C.

Figure 10A:
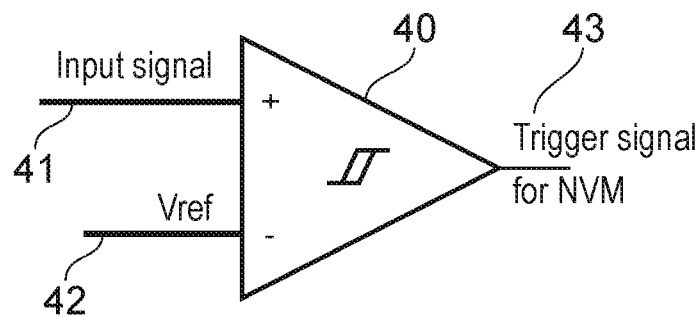
FIGS. 10(a), 10(b) and 10(c) show various components of a conditioning circuit in accordance with examples of the present disclosure.
Figure 10B:
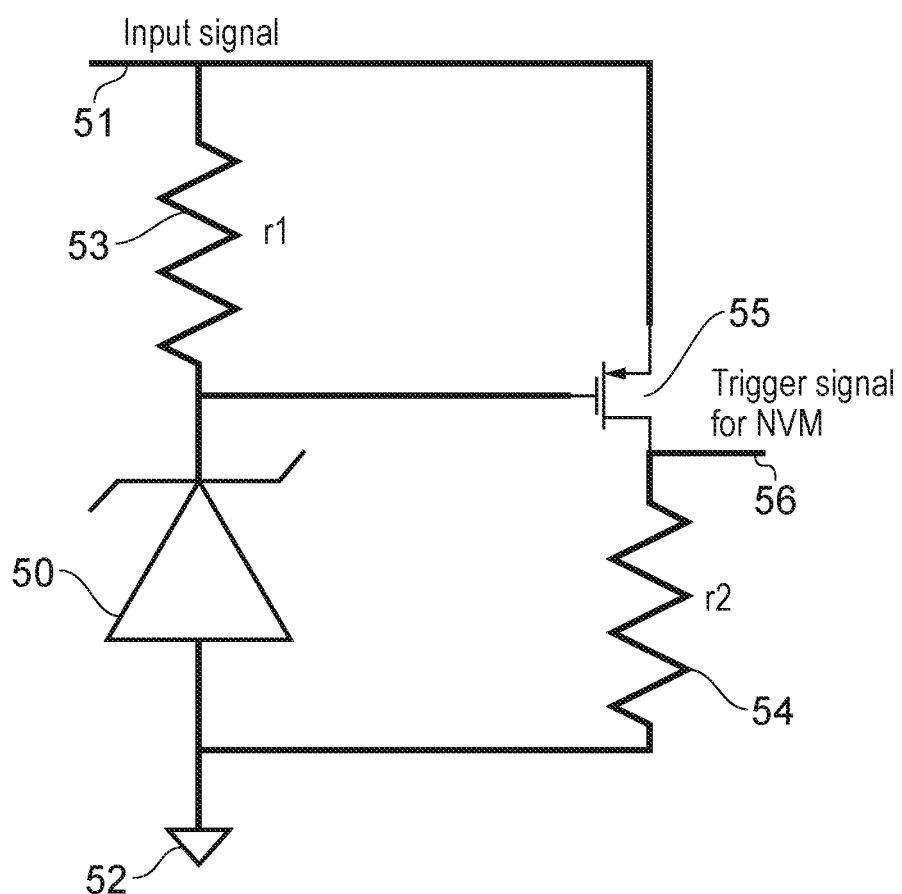

When the conditioning circuit is configured to compare the analog signal with a first threshold, and to log an event in the NVM element when the first threshold is exceeded, the way in which this comparison takes place could be using a comparator 40, as shown in FIG. 10(*a*). When the voltage of the analog signal being monitored, or the input signal 41, exceeds the reference voltage 42, then the comparator triggers a signal 43 for the NVM element to charge or discharge.

Alternatively to the comparator, a Zener diode 50, tied between the input signal 51 and ground 52 via a first resistor 53, may be used to set the trigger voltage, as shown in FIG. 10(*b*). However, in other examples, any breakdown-type device may be used. In the circuit of FIG. 10(*b*), once the input signal 51 goes above the voltage set by the breakdown of the Zener diode 50, the gate voltage of the transistor 56, tied between the trigger voltage set by the Zener diode 50 and ground 52 via a second resistor 54, will be clamped. As the input signal rises further, a voltage will be dropped across resistor r1. Once the threshold voltage of the transistor is exceeded, it will turn on and this will trigger a signal 56 for the NVM element to charge or discharge.

A one-shot pulse generator 67 could be added to the circuit at the output of the transistor, as shown in FIG. 10(*c*).

In FIG. 10(*c*), a Zener diode 60 is tied between the input signal 61 and ground 62 via a first resistor 63, and the Zener diode 60 sets the trigger voltage. Once the input signal 61 goes above the voltage set by the breakdown of the Zener diode 60, the gate voltage of the transistor 65, tied between the trigger voltage set by the Zener diode 60 and ground 62 via a second resistor 64, will be clamped. As the input signal rises further, a voltage will be dropped across resistor r1. Once the threshold voltage of the transistor is exceeded, it will turn on and this will trigger a signal 66 for the NVM element to charge or discharge.

The signal 66 causes the one-shot pulse generator 67 to produce pulses of fixed time periods for the NVM element to charge or discharge in response to the trigger signal 66. Each event that triggers a signal 66 causes charging or discharging of the NVM element by a certain known amount and the number of events is recorded but not the level of the event. In one example, the fixed time period could be 10 µs for a first threshold. In another example with n thresholds, the fixed time period could increase as the level of n increases so as to create a dynamic charge or discharge of the NVM element. This could result in operation of the analog signal gauge as shown in FIG. 8 or 9.

Figure 10C:
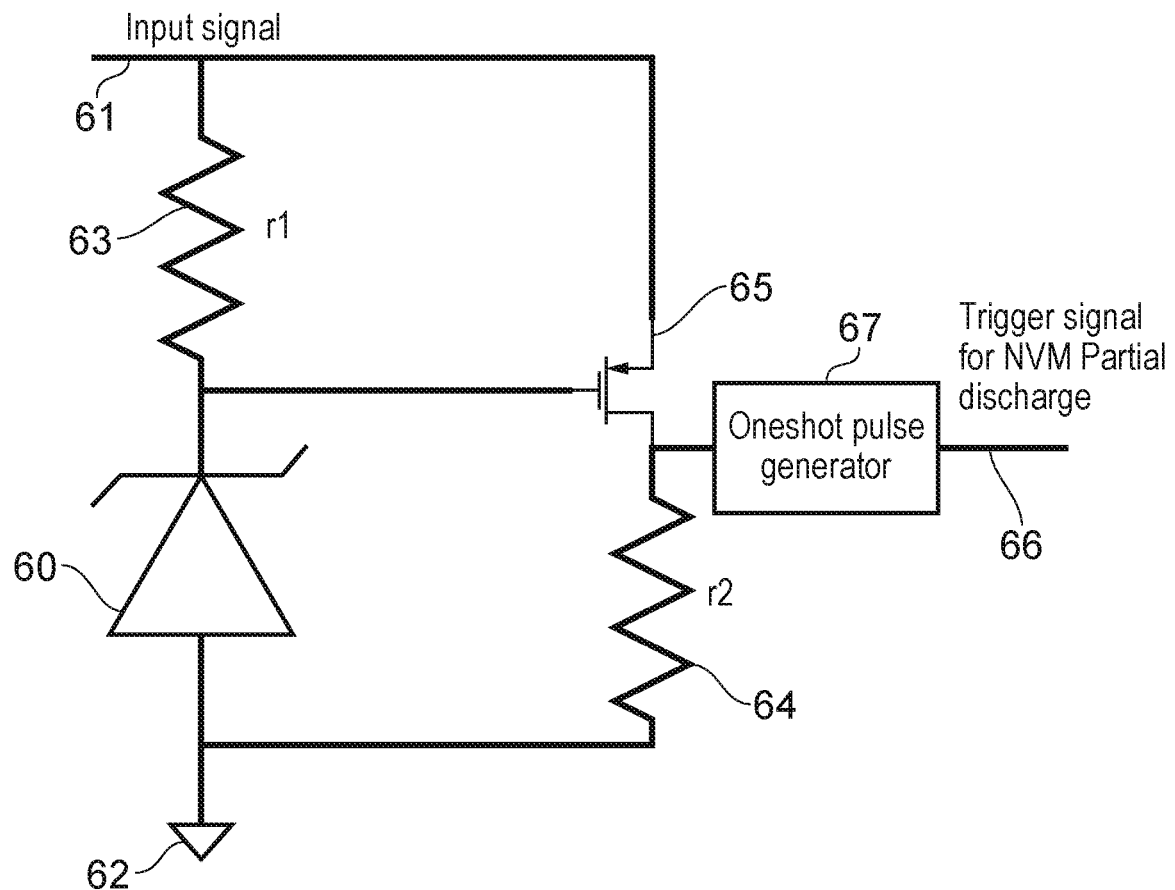
Figure 11:
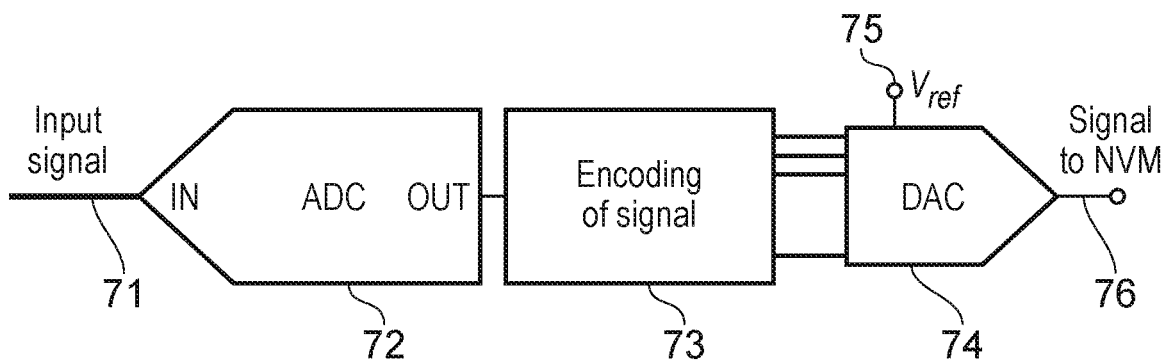
FIG. 11 shows another component of a conditioning circuit in accordance with examples of the present disclosure.

Alternatively to FIG. 10(c), using the circuit of FIG. 11, the input signal 71 may be digitalised, encoded in the digital domain and then converted back to an analog signal before a trigger signal 76 is sent to the NVM element. The circuit of FIG. 11 includes an analog-to-digital converter (ADC) 72, and encoder 73 and a digital-to-analog converter (DAC) 74. A reference voltage 75 is provided to the DAC 74 for stable and accurate conversion. The trigger signal 76 may modulate the pulse width and the amount change in charge stored in the NVM element so as to create a dynamic charge or discharge of the NVM element.

Figure 12A:
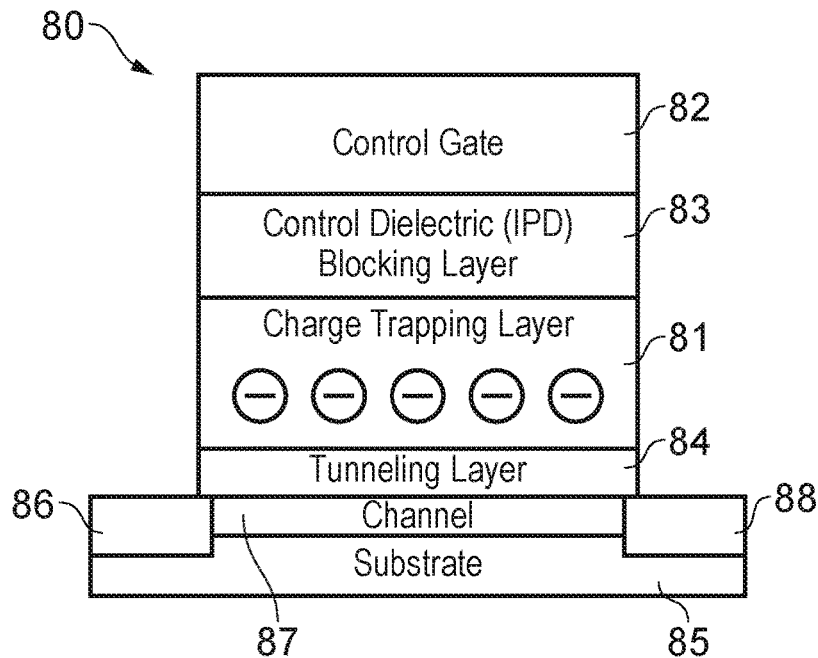
FIG. 12(a) shows yet another component of a conditioning circuit in accordance with examples of the present disclosure and FIG. 12(b) is a graph showing a measurement technique for the component of FIG. 12(a)

Floating gate technology may be used to hold electrical charge in a NVM element in order to store data, as shown in FIG. 12(a).

In the floating gate transistor 80, which acts as a non-volatile memory element, there is a floating gate 81 and a control gate 82. The two gates 81, 82 are separated from one another by a thin dielectric material, for example, an oxide layer 83. The floating gate 81 is isolated from the oxide layer and so any electrons placed on the floating gate are trapped. As a result, the memory element is non-volatile.

The floating gate transistor 80 works by adding (charging) or removing (discharging) electrons to and from the floating gate 81. The state of a bit, 0 or 1, depends on whether the floating gate 81 is charged or uncharged. When electrons are present on the floating gate 81, current cannot flow through the transistor and the bit state is 0. When electrons are removed from the floating gate 81, current is allowed to flow and the bit state is 1.

A tunnelling layer 84 lies between the floating gate 81 and a substrate 85 of the floating gate transistor 80. When a strong electric field is applied between a negatively charged source 86 and the positively charged control gate 82, electrons drawn into the floating gate 81 via a channel between the 87 that lies between the source 86 and the drain 88. The electrons move from the source 86 through the thin oxide layer 83 to the floating gate 81, where they are trapped. In an alternative method, a high current could be applied through the channel 87 to give electrons sufficient energy to break through the oxide layer 83. A positive charge can also be applied to the control gate 82, which attracts the electrons from the channel 87 into the floating gate 81, where they are trapped. In both methods, the amount of trapped charge changes the threshold voltage of the floating gate 81 that can be used as the first threshold to which the analog signal voltage is compared.

Figure 12B:
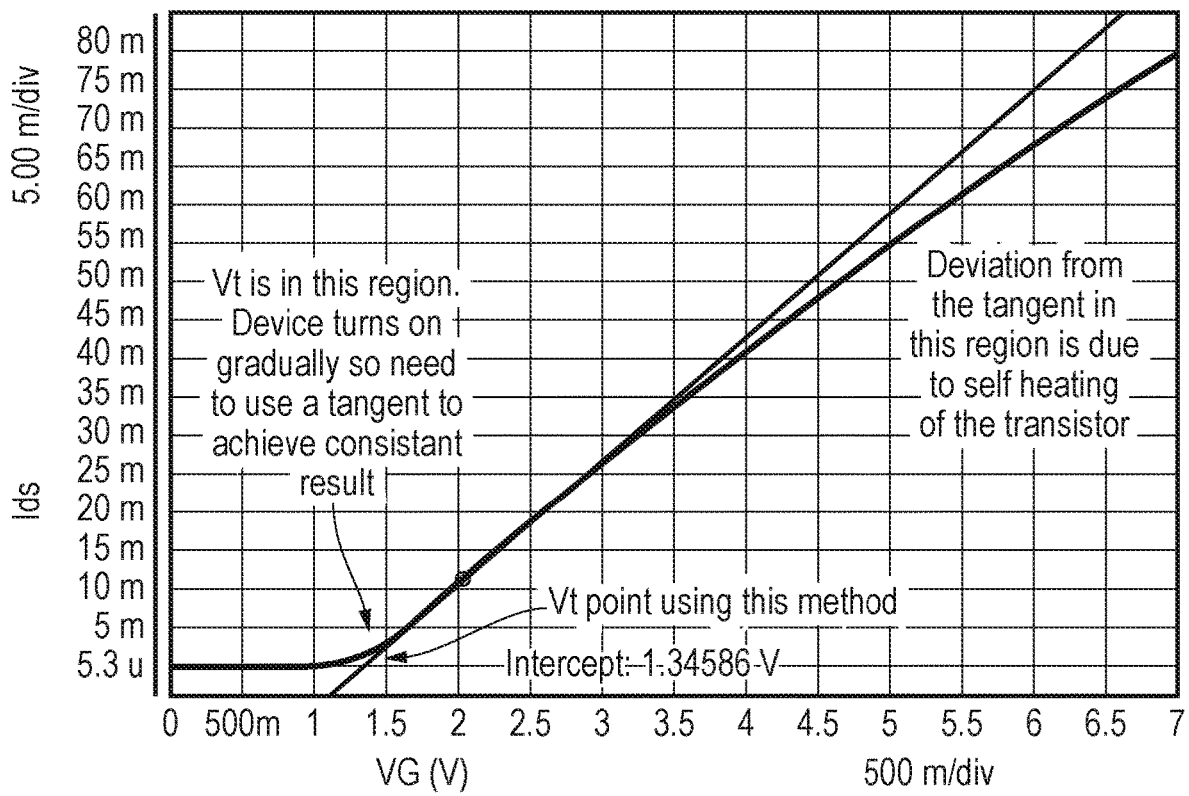

FIG. 12(b) shows how the threshold voltage of the floating gate 81 can be measured. A sense resistor can be connected at the drain 88 of the floating gate transistor 80. With a known value of the sense resistance, the voltage drop across sense resistor can be converted to a current $I_{ds}$, which is plotted against the control gate voltage $V_G$ to create a $V_G$ vs. $I_{ds}$ graph. A tangent can be plotted at the linear portion of the curve to find an intercept point in order to find the threshold voltage of the floating gate 81.

To remove trapped charge from the floating gate 81, the NVM element can be exposed to ultraviolet light, which causes electrons to leak away from the floating gate 81. Alternatively, a negative charge can be applied to the control gate 82, and a positive charge can be applied to the source 86 and the drain 88, which causes electrons to flow from the floating gate 81 to the channel 87.

Figure 13:
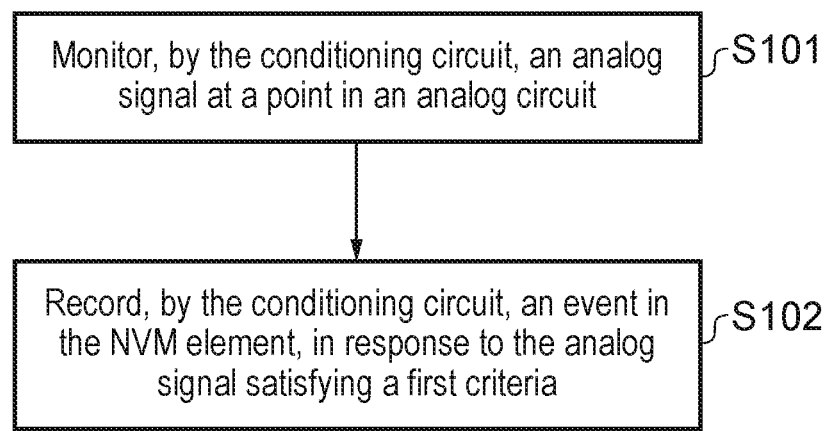
FIG. 13 is a flow chart that illustrates a method in accordance with a ninth example of the present disclosure.

FIG. 13 is a flow chart that illustrates a method in accordance with a ninth example of the present disclosure. At step S101, the conditioning circuit monitors an analog signal at a node in an analog circuit. Then, at step S102, the conditioning circuit records an event in the NVM element in response to the analog signal satisfying a first criteria.

Figure 14:
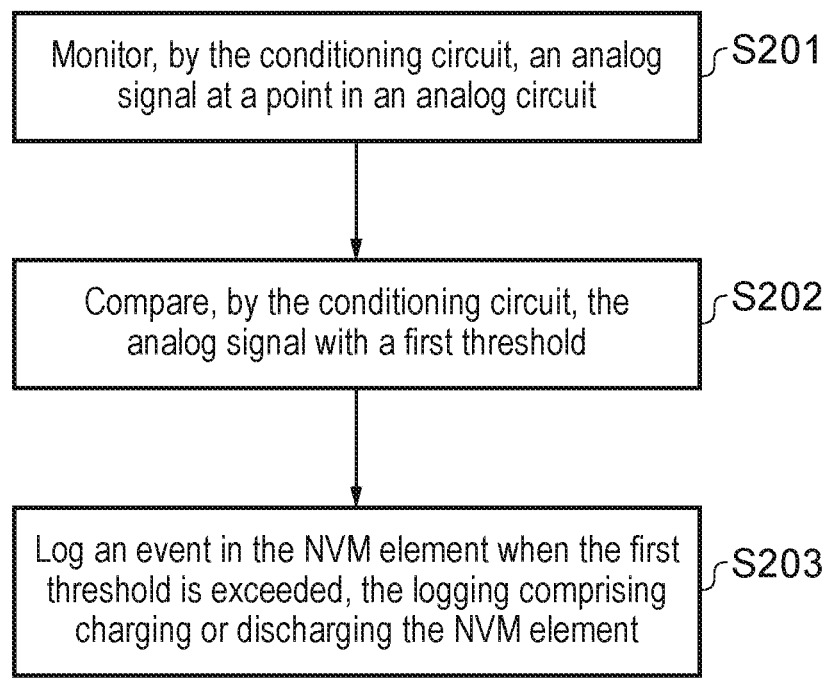
FIG. 14 is a flow chart that illustrates a method in accordance with a tenth example of the present disclosure.

FIG. 14 is a flow chart that illustrates a method in accordance with a tenth example of the present disclosure. At step 201, the conditioning circuit monitors an analog signal at a node in an analog circuit. Then, at step S202, the conditioning circuit compares the analog signal with a first threshold, and at step S203, the conditioning circuit logs an event in the NVM element when the first threshold is exceeded, wherein the logging comprises charging or discharging the NVM element.

Figure 15:
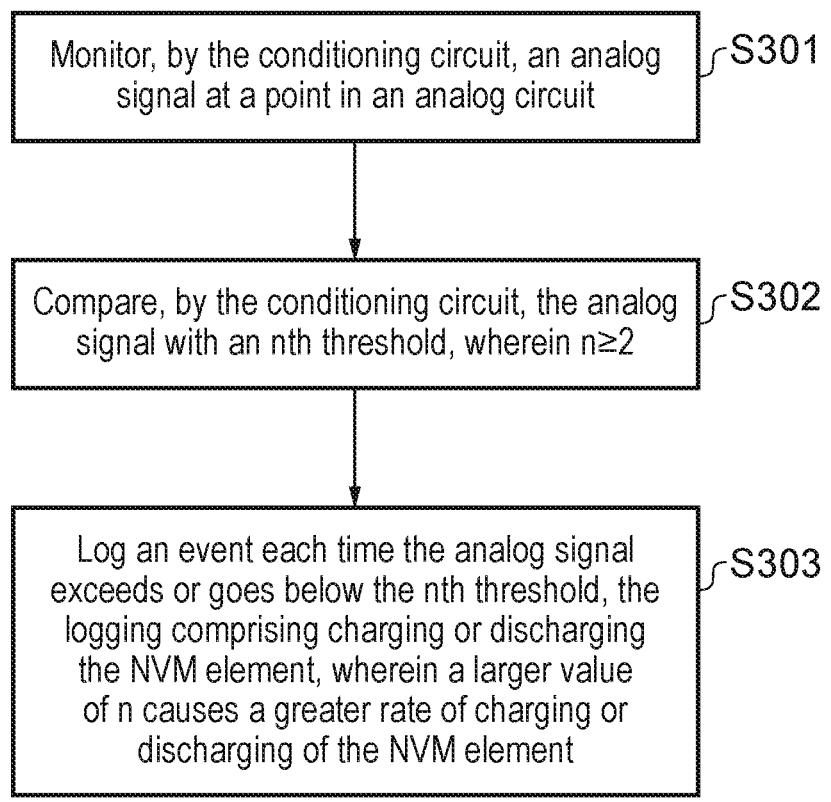
FIG. 15 is a flow chart that illustrates a method in accordance with an eleventh example of the present disclosure.

FIG. 15 is a flow chart that illustrates a method in accordance with an eleventh example of the present disclosure. At step 301, the conditioning circuit monitors an analog signal at a node in an analog circuit. Then, at step S302, the conditioning circuit compares the analog signal with an $n^{th}$ threshold, wherein n≥2, and logs an event each time the analog signal exceeds or goes below the $n^{th}$ threshold, the logging comprising charging or discharging the NVM element, wherein a larger value of n causes a greater rate of charging or discharging of the NVM element.

The above description relates to particularly preferred aspects of the disclosure, but it will be appreciated that other implementations are possible. Variations and modifications will be apparent to the skilled person, such as equivalent and other features which are already known and which may be used instead of, or in addition to, features described herein. Features that are described in the context of separate aspects or examples may be provided in combination in a single aspect or example. Conversely, features which are described in the context of a single aspect or example may also be provided separately or in any suitable sub-combination.

The invention claimed is:

1. An analog signal gauge, configured to monitor an analog signal at a monitored node in an analog circuit to detect an event of the analog circuit and to store analog information associated with the event in at least one non-volatile memory (NVM) element, the analog signal gauge, comprising:
   a conditioning circuit, interposed between the analog circuit and the NVM element, the conditioning circuit including an input coupled to the monitored node in the analog circuit and configured to monitor the analog signal at the monitored node in the analog circuit to detect at least one event indicated by the analog signal at the monitored node in the analog circuit, and including an output coupled to the input of the NVM element; and
   wherein the conditioning circuit is configured to compare the analog signal with a first threshold and to provide at the output of the conditioning circuit a signal for routing the analog signal to the input of the NVM to record analog information about the at least one event, indicated by the analog signal at the monitored node in the analog circuit, in the NVM element by charging or discharging the NVM, in response to the analog signal at the monitored node in the analog circuit exceeding the first threshold.

2. An analog signal gauge according to claim 1, wherein the recorded analog information corresponds to an adjustable level of the first threshold.

3. An analog signal gauge according to claim 2, wherein the recorded analog information represents an extent to which the analog signal exceeds the first threshold.

4. An analog signal gauge according to claim 1, wherein the conditioning circuit is further configured to log in the NVM element analog information corresponding to an event associated with the analog circuit each time the first threshold is exceeded.

5. An analog signal gauge according to claim 4, wherein the conditioning circuit is further configured to cause the NVM element to be reset to its original state of charge or discharge in response to the analog signal dropping below a reset threshold, the reset threshold being lower than the first threshold.

6. An analog signal gauge according to claim 5, wherein the conditioning circuit further comprises a breakdown-type device such as a Zener diode or a p-n junction diode for setting the reset threshold.

7. An analog signal gauge according to claim 1, wherein the conditioning circuit is further configured to compare the analog signal with an $n^{th}$ threshold, and to log in the NVM element analog information corresponding to an event associated with the analog circuit each time the analog signal exceeds or goes below the $n^{th}$ threshold, wherein $n \geq 2$, and wherein a larger value of n causes a greater rate of charging or discharging of the NVM element.

8. An analog signal gauge according to claim 1, wherein the conditioning circuit comprises a comparator for comparing the analog signal with a first threshold, $n^{th}$ threshold and/or reset threshold.

9. An analog signal gauge according to claim 1, wherein the conditioning circuit comprises a timer, and the conditioning circuit is configured to start the timer in response to the analog signal going over the first threshold, and to stop the timer in response to the analog signal going below the threshold, and to record in the NVM element the time spent over the threshold.

10. An analog signal gauge according to claim 9, wherein the conditioning circuit is further configured to compare the analog signal with the first threshold, and to log in the NVM element analog information corresponding to an event associated with the analog circuit in response to the analog signal remaining over the threshold for more than a predetermined amount of time.

11. An analog signal gauge according to claim 1, further comprising a control circuit, wherein the control circuit is configured to control a first aspect of the analog circuit in response to a first condition being met.

12. An analog signal gauge according to claim 1, further comprising a read circuit, configured to read the NVM element.

13. An analog signal gauge according to claim 12, wherein the read circuit includes a register, and the read circuit is only accessible if a correct code is entered into the register.

14. An analog signal gauge according to claim 1, wherein the analog signal gauge is configured for monitoring the analog signal in the analog circuit comprising an internal power supply or an analog subsystem.

15. An analog signal gauge according to claim 1, included in an integrated circuit with the NVM element.

16. An analog signal gauge according to claim 15, in combination with the analog circuit configured to be monitored.

17. The analog signal gauge circuit of claim 1, wherein the analog circuit includes a power supply circuit and the monitored node includes a power supply node.

18. The analog signal gauge circuit of claim 1, further comprising at least one non-volatile memory (NVM) element configured to store analog information received at an input of the NVM element.

19. A method of monitoring an analog signal, at a monitored node in an analog circuit to detect an event of the analog circuit and to record analog information associated with the event in at least one non-volatile memory (NVM) element, by an analog signal gauge, the analog signal gauge comprising a conditioning circuit, including an input coupled to the analog circuit and an output coupled to the at least one non-volatile memory (NVM) element wherein the method comprises:

monitoring, by the conditioning circuit, the analog signal at the monitored node in the analog circuit; and comparing by the conditioning circuit, the analog signal with a first threshold to detect an event associated with the analog circuit;

recording, by the conditioning circuit, analog information about the event in the NVM element including by charging or discharging the NVM element, in response to detecting the event by the analog signal exceeding the first threshold.

20. The method of claim 19, wherein the analog information corresponds to an adjustable level of the first threshold.

21. The method of claim 20, wherein the recorded analog information corresponds to an adjustable level of the first threshold.

22. The method of claim 20, wherein the method further comprises:

comparing, by the conditioning circuit, the analog signal with an $n^{th}$ threshold; and logging an event each time the analog signal exceeds or goes below the $n^{th}$ threshold, the logging comprising charging or discharging the NVM element, wherein $n \geq 2$, and wherein a larger value of n causes a greater rate of charging or discharging of the NVM element.

23. The method of claim 20, the recorded analog information represents an extent to which the analog signal exceeds the first threshold.

24. The method of claim 23, wherein the recorded analog information includes information about a magnitude by which the analog signal exceeds the first threshold.

25. The method of claim 23, wherein the recorded analog information includes information about a duration for which the analog signal exceeds the first threshold.

26. The method of claim 19, wherein the monitoring the analog circuit includes monitoring a power supply node of a power supply circuit.

* * * * *

UNITED STATES PATENT AND TRADEMARK OFFICE
CERTIFICATE OF CORRECTION

PATENT NO. : 10,917,102 B2
APPLICATION NO. : 16/356985
DATED : February 9, 2021
INVENTOR(S) : Bradley et al.

Page 1 of 1

It is certified that error appears in the above-identified patent and that said Letters Patent is hereby corrected as shown below:

In the Claims

In Column 10, Line 40, in Claim 1, delete "gauge," and insert --gauge-- therefor In Column 12, Line 23, in Claim 19, delete "comparing" and insert --comparing,-- therefor Signed and Sealed this
Eleventh Day of May, 2021

Drew Hirshfeld
*Performing the Functions and Duties of the*
*Under Secretary of Commerce for Intellectual Property and*
*Director of the United States Patent and Trademark Office*